United States Patent
Kang et al.

(10) Patent No.: US 8,432,755 B2
(45) Date of Patent: Apr. 30, 2013

(54) RANDOM ACCESS MEMORY DEVICES HAVING WORD LINE DRIVERS THEREIN THAT SUPPORT VARIABLE-FREQUENCY CLOCK SIGNALS

(75) Inventors: Byung-Ho Kang, Suwon-si (KR); Youngjae Son, Hwaseong-si (KR); Yongjin Yoon, Seoul (KR)

(73) Assignee: Samsung Electronics Co., Ltd. (KR)

( * ) Notice: Subject to any disclaimer, the term of this patent is extended or adjusted under 35 U.S.C. 154(b) by 205 days.

(21) Appl. No.: 13/018,539

(22) Filed: Feb. 1, 2011

(65) Prior Publication Data

US 2011/0242912 A1    Oct. 6, 2011

(30) Foreign Application Priority Data

Apr. 1, 2010    (KR) ........................ 10-2010-0029744

(51) Int. Cl.
*G11C 7/00*    (2006.01)
(52) U.S. Cl.
USPC .................... 365/194; 365/230.06; 365/233.1
(58) Field of Classification Search .................. 365/194, 365/230.06, 233, 201, 196, 202, 189.05, 365/220, 226, 189.06, 233.1
See application file for complete search history.

(56) References Cited

U.S. PATENT DOCUMENTS

| | | | |
|---|---|---|---|
| 5,812,482 A | | 9/1998 | Jiang et al. |
| 6,865,705 B2 * | | 3/2005 | Tomizawa et al. ............. 714/727 |
| 2004/0079936 A1 | | 4/2004 | Tomita et al. |
| 2009/0116312 A1 * | | 5/2009 | Carpenter et al. ............ 365/194 |

FOREIGN PATENT DOCUMENTS

| JP | 2003-030991 | 1/2003 |
|---|---|---|
| JP | 2004-152348 | 5/2004 |

* cited by examiner

*Primary Examiner* — Dang Nguyen
(74) *Attorney, Agent, or Firm* — Myers Bigel Sibley & Sajovec, P.A.

(57) ABSTRACT

Integrated circuit memory devices include an array of memory cells electrically coupled to a plurality of word lines and a word line driver circuit. The word line driver circuit includes a variable-width pulse generator having a first delay unit therein. The word line driver circuit is configured to drive a selected one of the plurality of word lines with a first word line signal having a leading edge synchronized with a leading edge of a clock signal and a trailing edge synchronized with a trailing edge of the clock signal when a one-half period of the clock signal is greater than a length of delay provided by the first delay unit. The word line driver circuit is further configured to drive the selected one of the plurality of word lines with a second word line signal having a leading edge synchronized with the leading edge of a clock signal and a trailing edge synchronized with an edge of a signal generated by the first delay unit when the one-half period of the clock signal is less than the length of the delay provided by the first delay unit.

19 Claims, 6 Drawing Sheets

RANDOM ACCESS MEMORY DEVICES HAVING WORD LINE DRIVERS THEREIN THAT SUPPORT VARIABLE-FREQUENCY CLOCK SIGNALS

REFERENCE TO PRIORITY APPLICATION

This application claims priority to Korean Patent Application No. 10-2010-0029744, filed Apr. 1, 2010, the contents of which are hereby incorporated herein by reference.

FIELD

The present invention relates to semiconductor memory devices and, more particularly, to semiconductor memory devices synchronized to clock signals.

BACKGROUND

Semiconductor memory devices are memory devices that are implemented using semiconductors such as silicon (Si), germanium (Ge), gallium arsenide (GaAs), and indium phosphide (InP). The semiconductor memory devices are largely classified into volatile data storage devices and nonvolatile data storage devices.

The volatile data storage devices lose stored data when a power supply is interrupted. Examples of the volatile data storage devices include static random access memory (SRAM) devices, dynamic random access memory (DRAM) devices, and synchronous dynamic random access memory (SDRAM) devices. The nonvolatile data storage devices retain stored data even when power supply is interrupted. Examples of the nonvolatile data storage devices include read-only memory (ROM) devices, programmable read-only memory (PROM) devices, erasable programmable read-only memory (EPROM) devices, electrically erasable programmable read-only memory (EEPROM) devices, flash memory devices, phase-change random access memory (PRAM) devices, magnetic random access memory (MRAM) devices, resistive random access memory (RRAM) devices, and ferroelectric random access memory (FRAM) devices. The flash memory devices are typically classified into NOR flash memory devices and NAND flash memory devices.

SRAM devices typically operate faster than DRAM devices. Accordingly, SRAM is mainly used for a memory device of a central processing unit (CPU) such as a register, which requires a fast operating speed. Moreover, SRAM is used for an external cache, a digital signal processing circuit, and so forth. However, SRAM is typically not suitable for a main memory of a personal computer (PC) because it typically has a lower degree of integration than DRAM.

SUMMARY

Integrated circuit memory devices according to embodiments of the invention include an array of memory cells electrically coupled to a plurality of word lines and a word line driver circuit, which is electrically coupled to the plurality of word lines. The word line driver circuit includes a variable-width pulse generator having a first delay unit therein. The word line driver circuit is configured to drive a selected one of the plurality of word lines with a first word line signal. This first word line signal has a leading edge synchronized with a leading edge of a clock signal and a trailing edge synchronized with a trailing edge of the clock signal whenever a one-half period of the clock signal is greater than a length of delay provided by the first delay unit. The word line driver circuit is further configured to drive the selected one of the plurality of word lines with a second word line signal. This second word line signal has a leading edge synchronized with the leading edge of a clock signal and a trailing edge synchronized with an edge of a signal generated by the first delay unit whenever the one-half period of the clock signal is less than the length of the delay provided by the first delay unit.

According to some additional embodiments of the invention, the first delay unit is responsive to the clock signal and the variable-width pulse generator includes a logic circuit (e.g., AND gate) having a first input terminal responsive to the clock signal and a second input terminal electrically connected to an output of the first delay unit. The delay provided by the first delay unit may be determined by an odd number of inverters therein.

The variable-width pulse generator may also include a totem pole arrangement of a plurality of transistors. For example, in the event the logic circuit is an AND gate, the totem pole arrangement of the plurality of transistors may include a first PMOS transistor having a gate terminal responsive to the clock signal and a second PMOS transistor having a gate terminal electrically connected to an output of the AND gate. The totem pole arrangement of the plurality of transistors may also include an NMOS transistor having a gate terminal electrically connected to the output of the AND gate. The word line driver circuit may also include a latch having an input terminal electrically connected to an output of the variable-width pulse generator and an output terminal electrically connected to the selected one of the plurality of word lines.

According to still further embodiments of the invention, a sense amplifier circuit is provided, which is electrically coupled to the array of memory cells by a plurality of pairs of bit lines. A sense amplifier driver is also provided, which is configured to drive the sense amplifier with a sense amplifier enable pulse in response to the clock signal. This sense amplifier driver may include a pulse generator having a second delay unit therein. The delay provided by the second delay unit sets a duration of the sense amplifier enable pulse. This sense amplifier enable pulse may have a leading edge that is synchronized with a trailing edge of the clock signal. The memory device may also include a clock delay circuit, which is configured to generate a delayed clock signal in response to the clock signal. According to these embodiments of the invention, the sense amplifier driver may be responsive to the clock signal and the delayed clock signal. This sense amplifier driver may further include a totem pole arrangement of a plurality of transistors. This totem pole arrangement includes a first PMOS pull-up transistor having a gate terminal responsive to the clock signal, a second PMOS pull-up transistor having a gate terminal responsive to an inverted version of the delayed clock signal, and an NMOS pull-down transistor having a gate terminal responsive to the inverted version of the delayed clock signal.

According to additional embodiments of the invention, an integrated circuit memory device includes an array of random access memory (RAM) cells electrically coupled to a plurality of word lines. A word line driver circuit is provided, which is electrically coupled to the plurality of word lines. The word line driver circuit includes a variable-width pulse generator containing a first delay unit therein. This word line driver circuit is configured to drive a selected one of the plurality of word lines with a word line pulse having a minimum duration set by the first delay unit and a maximum duration equivalent to a one-half period of a clock signal. In particular, the word line driver circuit may be configured to operate with clock signals having different frequencies. According to these embodiments of the invention, an active phase of the word line pulse has a duration equivalent to the minimum duration for all clock signals having periods less than two times a delay provided by the delay unit.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF THE EMBODIMENTS

Hereinafter, these embodiments are provided so that this disclosure will be thorough and complete, and will fully convey the scope of the inventive concept to those skilled in the art. Embodiments of the inventive concept will be described with reference to a static RAM (hereinafter, referred to as SRAM). That is, a semiconductor memory device is assumed as a SRAM device. However, a semiconductor memory device according to embodiments of the inventive concept is not limited to the SRAM device.

Figure 1:
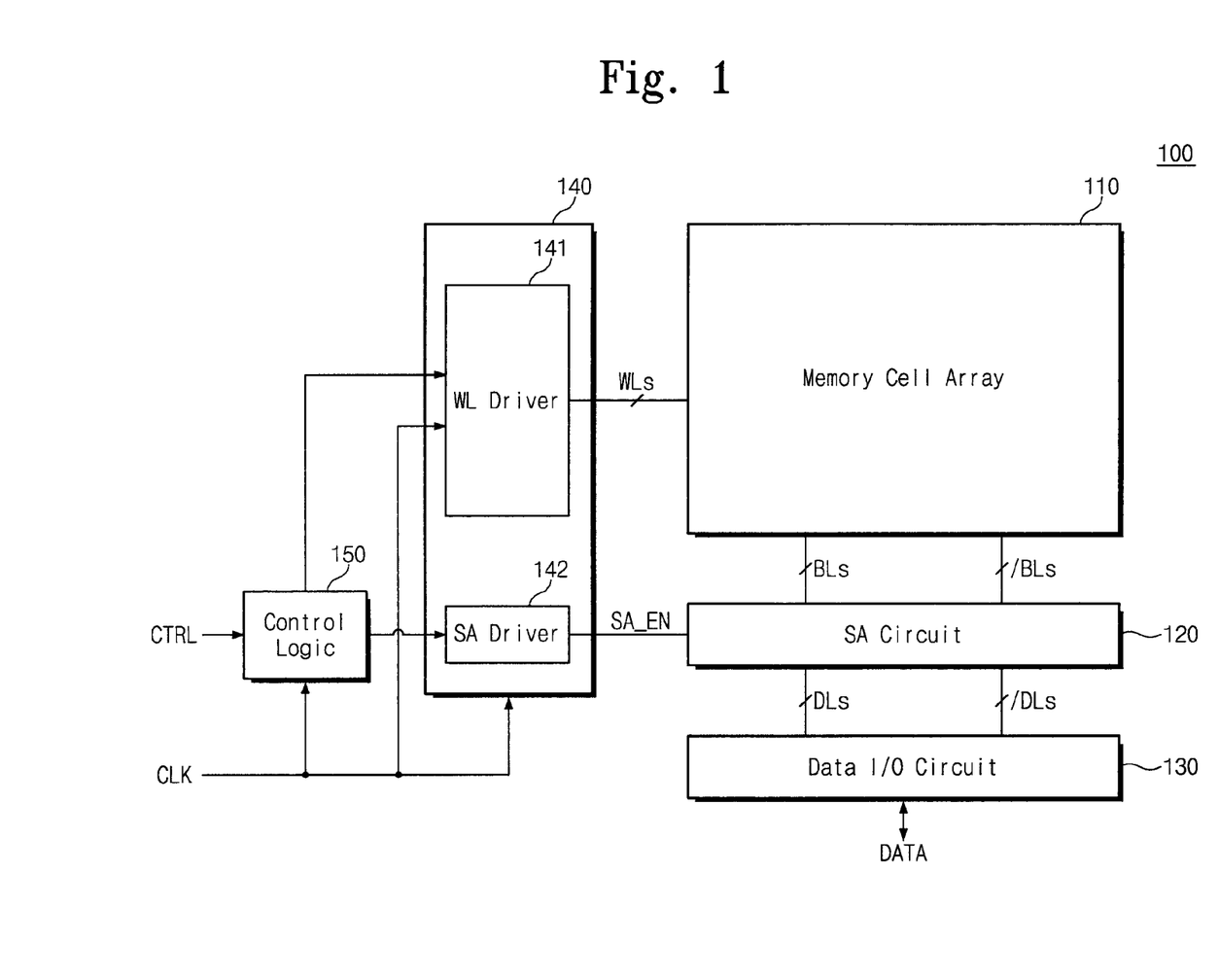
FIG. 1 is a block diagram illustrating a part of a SRAM device according to an embodiment of the inventive concept.

FIG. 1 is a block diagram illustrating a part of a SRAM device according to an embodiment of the inventive concept. Referring to FIG. 1, the SRAM device 100 includes a memory cell array 110, a sense amplifier (SA) circuit 120, a data input/output (I/O) circuit 130, a driving circuit 140 and a control logic 150, connected as illustrated. A row address decoder (not shown) may also be included within the driving circuit 140.

The memory cell array 110 is connected to the driving circuit 140 through word lines WLs and is connected to the sense amplifier circuit 120 through pairs of bit lines. The memory cell array 110 includes a plurality of memory cells arranged in a matrix form. Each memory cell is connected to a word line WL and a corresponding bit line pair BL and /BL. The sense amplifier circuit 120 includes a plurality of sense amplifiers. Each sense amplifier is connected to a corresponding bit line pair BL and /BL, and operates in response to a sense amplifier enable signal SA_EN. Each sense amplifier senses and amplifies a voltage difference between a bit line pair BL and /BL selected by a column gate circuit (not shown) and then transmits the amplified voltage difference to the data I/O circuit 130 through a data line pair DL and /DL.

The data I/O circuit 130 is connected to the sense amplifier circuit 120 through the data line pair DLs and /DLs. The data input circuit 130 may include typical components such as a data buffer. The data I/O circuit 130 transmits data DATA provided from the sense amplifier circuit 120 to the external.

The data I/O circuit 130 operates in response to a control of the control logic circuit 150.

The driving circuit 140 includes a word line driver 141 and a sense amplifier driver 142. The driving circuit 140 operates in response to a clock signal CLK. This will be described in more detail with reference to FIG. 2. The word line driver 141 drives a word line WL selected based on a decoded row address provided from the row address decoder (not shown). The word line driver 141 generates a word line signal to drive the selected word line WL. The sense amplifier driver 142 is connected to the sense amplifier circuit 120. The sense amplifier driver 142 drives sense amplifiers in response to a control of the control logic circuit 150. The sense amplifier driver 142 generates a sense amplifier enable signal SA_EN to drive sense amplifiers.

The row address decoder within the driving circuit 140 decodes a row address among addresses ADDR provided from the external and selects a word line WL based on the decoded row address.

The control logic circuit 150 controls important operations of the SRAM device 100. The control logic circuit 150 operates in response to a control signal CTRL and a clock signal CLK delivered from the external.

As well known, in order to read data stored in a memory cell of a SRAM device, firstly, a word line signal is applied to a word line corresponding to a selection memory cell. Next, a voltage difference between a bit line pair BL and /BL connected to the selection memory cell is generated. Next, the sense amplifier senses and amplifies the voltage difference between a bit line pair BL and /BL in response to a sense amplifier enable signal SA_EN.

At this point, a time point for sensing a pulse width of a word line signal and a voltage difference between a bit line pair BL and /BL affect operation error occurrence. A word line signal for preventing an operation error needs to be maintained until a voltage difference between a bit line pair BL and /BL is greater than a critical value. Moreover, a voltage difference between a bit line pair BL and /BL should be sensed after it is increased more than a critical value.

The SRAM device may be divided into a high speed SRAM device and a low speed SRAM device. The high speed SRAM device operates by a clock signal of a high frequency and a driving voltage of a high voltage. On the other hand, the low speed SRAM device operates by a block signal of a low frequency and a driving voltage of a low voltage. Due to these characteristics, compared to the high-speed SRAM device, the low speed SRAM device may take longer time to increase a voltage difference between a bit line pair BL and /BL greater than a critical value. That is, compared to the high speed SRAM device, a develop time of a bit line pair BL and /BL may be longer in the low speed SRAM device. Accordingly, in order to prevent an operation error in the low speed SRAM device, a pulse width of a word line needs to be increased, and a voltage difference between a bit line pair BL and /BL needs to be delayed.

The SRAM device 100 includes a sense amplifier driver for adjusting a pulse width of a word line signal according to a frequency change of a clock signal CLK using both a rising edge and a falling edge of a block signal CLK and a sense amplifier driver for adjusting a time point for detecting a voltage difference between a bit line pair BL and /BL. Accordingly, the SRAM device 100 may perform stable operations in both a high speed operation mode and a low speed operation mode.

Figure 2:
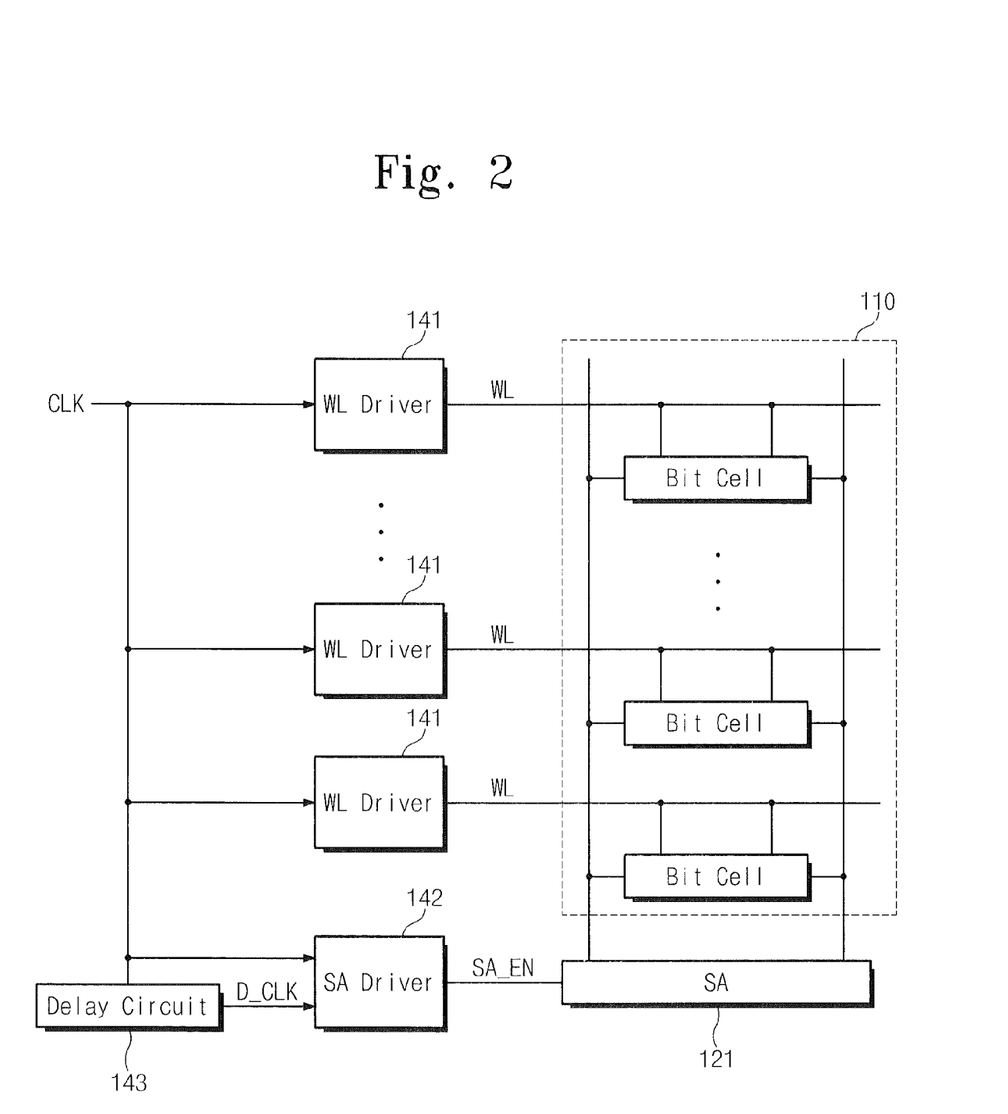
FIG. 2 is a block diagram that more specifically illustrates a part of the SRAM device shown in FIG. 1.

FIG. 2 is a block diagram that more specifically illustrates a part of the SRAM device shown in FIG. 1. For concise description, memory cells constituting one column among a plurality of memory cells of the memory cell array 110 are illustrated. Hereinafter, overlapping content described with reference to FIG. 1 will be omitted. Referring to FIG. 2, the driving circuit 140 of FIG. 1 of the SRAM device may further include a clock signal delay circuit 143 for delaying a clock signal CLK. The clock signal delay circuit 143 delays the clock signal CLK by a predetermined time to generate a delay clock signal D_CLK. The clock signal delay circuit 143 provides the delay clock signal to the sense amplifier driver 142.

The sense amplifier 121 is connected to memory cells constituting one column through a bit line pair BL and /BL. The sense amplifier 121 senses and amplifies a voltage difference between the bit line pair BL and /BL in response to a sense amplifier enable signal SA_EN provided from the sense amplifier driver 142.

The word line driver 141 is connected to each memory cell through a corresponding word line WL. The word line driver 141 generates a word line signal in response to the clock signal CLK. At this point, the word line driver 141 adjusts a pulse width of a word line signal using both a rising edge and a falling edge. That is, the word line driver 141 adjusts a pulse width of a word line signal according to a frequency of the clock signal CLK. This will be described in more detail with reference to FIGS. 3, 5, and 6.

The sense amplifier driver 142 generates a sense amplifier enable signal SA_EN in response to a rising edge of a delay clock signal D_CLK in the high speed operation mode. At this point, a fixed delay time between the clock signal CLK and the delay clock signal D_CLK determines an occurrence time point of the sense amplifier enable signal SA_EN in the high speed operation mode. On the other hand, the sense amplifier driver 142 generates a sense amplifier enable signal SA_EN in response to a falling edge of a clock signal CLK in the low speed operation mode. As a result, the sense amplifier driver 142 adjusts an occurrence time point of the sense amplifier enable signal SA_EN according to a frequency of a clock signal CLK. This will be described in more detail with reference to FIGS. 4 through 6.

Figure 3:
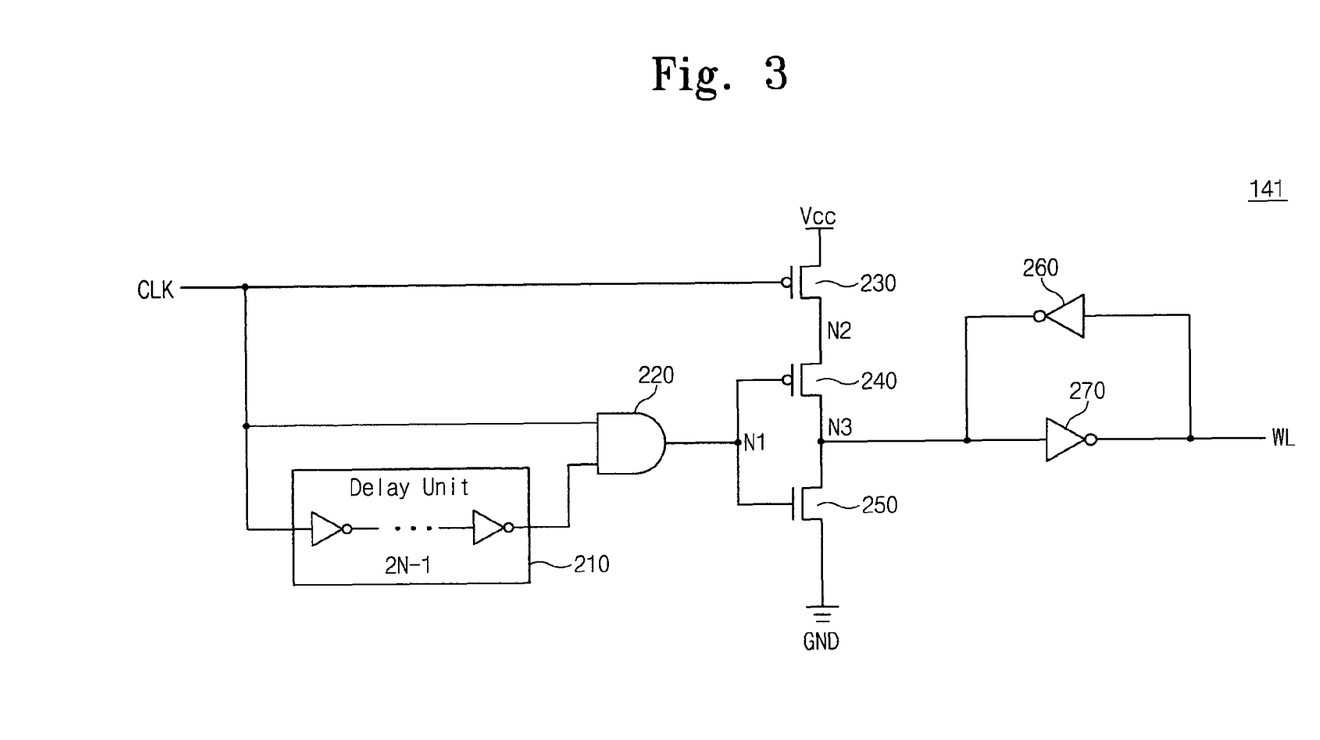
FIG. 3 is a circuit diagram illustrating the word line driver shown in FIG. 2.

FIG. 3 is a circuit diagram illustrating the word line driver shown in FIG. 2. Referring to FIG. 3, the word line driver 141 includes a signal delay unit 210, an AND gate 220, first and second PMOS transistors 230 and 240, an NMOS transistor 250, and first and second inverters 260 and 270. The clock signal CLK is delivered to an input of the signal delay unit 210, a gate of the first PMOS transistor 230, and a first input of the AND gate 220. An output of the signal delay unit 210 is connected to a second input of the AND gate 220. An output of the AND gate 220, a gate of the second PMOS transistor 240, and a gate of the NMOS transistor 260 are connected to a first node N1.

A drain and a source of the first PMOS transistor 230 are connected to a driving power Vcc and a second node N2, respectively. A drain and a source of the second PMOS transistor 240 are connected to second and third nodes N2 and N3, respectively. A drain and a source of the NMOS transistor 250 are connected to a third node N3 and a ground GND, respectively. The first and second inverters 260 and 270 constitute a latch between the third node N3 and the word line WL.

The signal delay unit 210 and the AND gate 220 constitute a short pulse generator. The signal delay unit 210 delays a clock signal CLK for a predetermined time and inverts the delayed clock signal CLK, and then outputs the inverted clock signal CLK. For this, the signal delay unit 210 may include an odd number (for example, 2N−1 where N is a natural number) of inverters. Herein, as the number of inverters is increased, a delay time is increased. The AND gate 220 performs an AND operation on a clock signal CLK and an output signal of the signal delay unit 210.

The short pulse generator generates a short pulse through an AND operation on the clock signal CLK and the inverted delay signal. At this point, a pulse width of the short pulse generated by the AND operation is proportional to a fixed delay time of the signal delay unit 210.

The short pulse shifts into a high level in response to a rising edge of the clock signal CLK. At this point, the first transistor 230 is turned off by the clock signal CLK. Moreover, the second PMOS transistor 240 is turned off by a short pulse and the NMOS transistor 250 is turned on. When the NMOS transistor 250 is turned on, an output signal of the second inverter 270 shifts into a high level as a word line signal. Consequently, the word line signal shifts into a high level in response to a rising edge of the clock signal CLK.

In order to describe a time point when the word line signal shifts into a low level, it is assumed that a falling edge of the clock signal CLK occurs before a falling edge of a short pulse (i.e., characteristic of the high speed operation mode). First, if a falling edge of a clock signal CLK occurs, the first PMOS transistor 230 is turned on. However, since the second PMOS transistor 240 is still turned off and the NMOS transistor 250 is turned on, the word line signal maintains a high level.

Later, if a falling edge of a short pulse occurs, all of the first and second PMOS transistor 230 and 240 are turned on and the NMOS transistor 250 is turned off. Due to this, an output signal of the second inverter 280 shifts into a low level as a word line signal. As a result, a word line signal shifts into a low level in response to a falling edge. This means that the word line signal corresponds to a short pulse that is generated in response to a rising edge of the clock signal CLK in the high speed operation mode.

Unlike this, it is assumed that a falling edge of a clock signal CLK occurs after a falling edge of a short pulse (i.e., characteristic of the low speed operation mode). First, a falling edge of a short pulse occurs, the second PMOS transistor 240 is turned on and the NMOS transistor 250 is turned off. However, the first PMOS transistor 230 is still turned off. Accordingly, the third node N3 floats. Even when the third node N3 floats, the word line signal maintains a high level by the first and second inverters 260 and 270 that operate as a latch.

Next, if a falling edge of a clock signal CLK occurs, all of the first and second PMOS transistors 230 and 240 are turned on. Due to this, an output signal of the second inverter 270 shifts into a low level as a word line signal. As a result, the word line signal shifts into a low level in response to a falling edge of the clock signal CLK.

As mentioned above, the word line signal shifts into a low level in response to a falling edge that occurs later among falling edges of a short pulse, which are generated in response to a falling edge of a clock signal CLK and a rising edge of a clock signal CLK. Due to this, a pulse width of a word line signal in the high speed operation mode during which a clock signal CLK of a high frequency is inputted guarantees a pulse width of a short pulse determined by a fixed delay time. On the contrary, as a pulse width of a clock signal CLK is increased in the low speed operation mode during which a clock signal CLK of a low frequency is inputted, a pulse width of a word line signal is increased.

Figure 4:
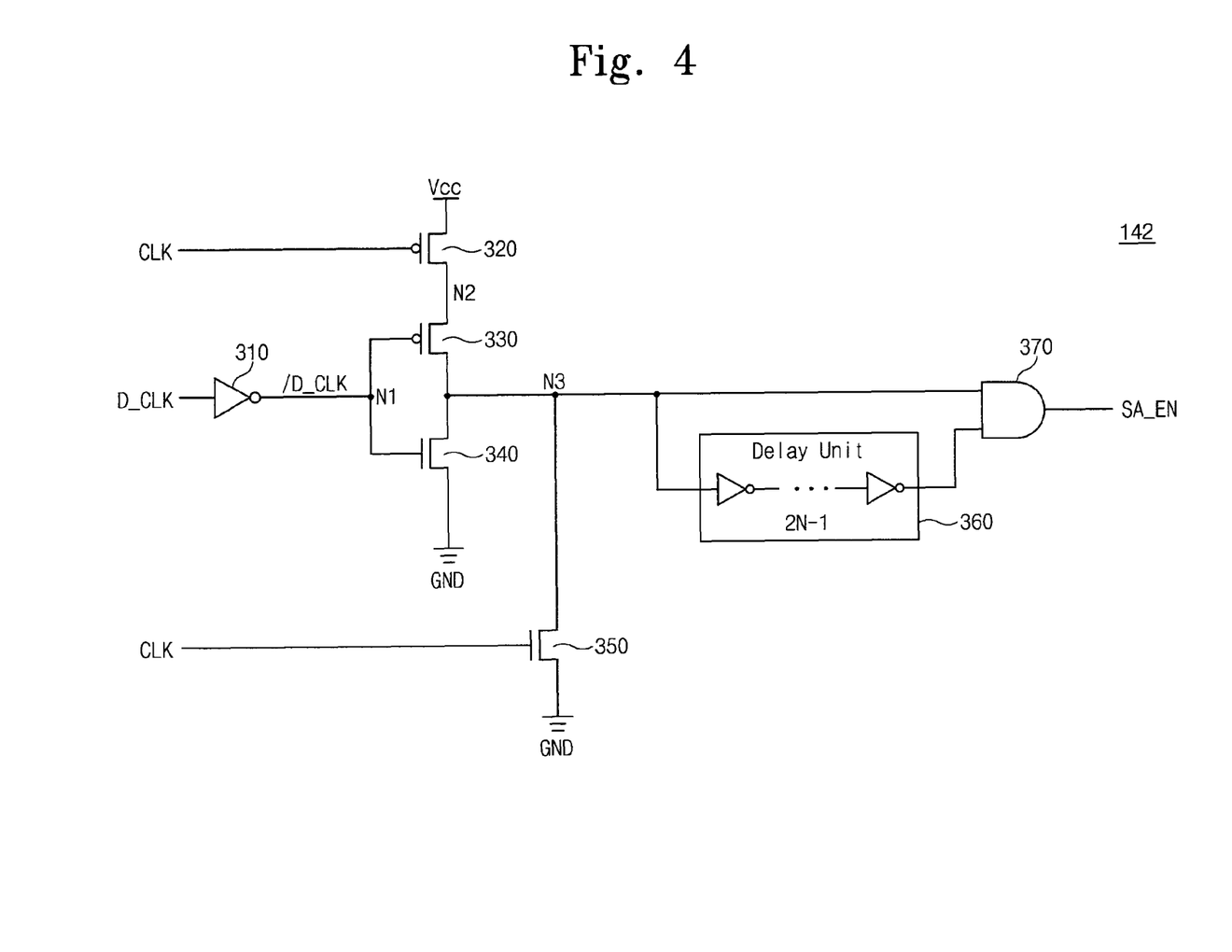
FIG. 4 is a circuit diagram illustrating a sense amplifier driver shown in FIG. 2.

FIG. 4 is a circuit diagram illustrating a sense amplifier driver shown in FIG. 2. Referring to FIG. 4, the sense amplifier driver 142 includes an inverter 310, first and second PMOS transistors 330 and 340, first and second NMOS transistors 340 and 350, a signal delay unit 360, and an AND gate

370. The sense amplifier driver 142 operates in response to a clock signal CLK and a delay clock signal D_CLK that delays the clock signal CLK. As mentioned above, the delay clock signal D_CLK is provided from the clock signal delay circuit 143 of FIG. 2. The clock signal CLK is delivered to a gate of the first PMOS transistor 320 and a gate of the second NMOS transistor 350. The delay clock signal D_CLK is delivered to an input of the inverter 310.

An output of the inverter 310, a gate of the second PMOS transistor 330, and a gate of the first NMOS transistor 340 are connected to a first node N1. A drain and a source of the first PMOS transistor 320 are connected to a driving power Vcc and a second node N2, respectively. A drain and a source of the second PMOS transistor 330 are connected to second and third nodes N2 and N3, respectively. A drain and a source of the first and second NMOS transistors 340 and 350 are connected to third node N3 and a ground GND, respectively.

The inverter 310 inverts a delay clock signal D_CLK and outputs an inverted delay clock signal /D_CLK. The inverted delay clock signal /D_CLK is delivered to a gate of the second PMOS transistor and a gate of the first NMOS transistor 340.

The first and second PMOS transistor 320 and 330 and the first and second NMOS transistors 340 and 350 perform a NOR operation on the clock signal CLK and the inverted delay clock signal /D_CLK. A signal generated by the NOR operation is delivered to the third node N3.

The signal delay unit 360 and the AND gate 370 constitute a short pulse generator. The signal delay unit 360 delays a signal delivered to the third node N3 for a predetermined time, and inverts and outputs the signal. For this, the signal delay unit 360 may include an odd number (for example, 2N−1 where N is a natural number) of inverters. Herein, as the number of inverters is increased, a delay time is increased. The AND gate 370 perform an AND operation on a signal delivered to the third node N3 and an output signal of the signal delay unit 360.

The short pulse generator generates a short pulse by performing an AND operation on a signal delivered to the third node N3 and the inverted delay signal. At this point, a pulse width of a short pulse generated by the AND operation is proportional to a fixed delay time of the signal delay unit 360. The short pulse is provided to the sense amplifier 121 of FIG. 2 as a sense amplifier enable signal SA_EN.

In order to describe a time point when the sense amplifier enable signal SA_EN occurs, it is assumed that a falling edge of the clock signal CLK occurs before a rising edge of the delay clock signal D_CLK (that is, characteristic of the high speed operation mode). First, when a falling edge of the clock signal CLK occurs, the first PMOS transistor 320 is turned on and the second NMOS transistor 350 is turned off. However, a signal delivered to the third node N3 maintains a low level because the second PMOS transistor 330 is turned off and the first NMOS transistor 340 is turned on.

Later, when a rising edge of the delay clock signal D_CLK occurs, the second PMOS transistor 330 is turned on and the first NMOS transistor 340 is turned off. Due to this, a signal delivered to the third node shifts into a high level. Then, the short pulse generator generates a rising edge of the sense amplifier enable signal SA_EN in response to a rising edge of a signal delivered to the third node N3. As a result, the sense amplifier driver 142 generates the sense amplifier enable signal SA_EN in response to a rising edge of the delay clock signal D_CLK in the high speed operation mode.

Unlike this, it is assumed that a falling edge of a clock signal CLK occurs after a rising edge of a delay clock signal D_CLK (i.e., characteristic of the low speed operation mode). First, a rising edge of the delay clock signal D_CLK occurs, the second PMOS transistor 330 is turned on and the first NMOS transistor 340 is turned off. However, the first PMOS transistor 320 is still turned off. However, a signal delivered to the third node N3 maintains a low level because the first PMOS transistor 320 is turned off and the second NMOS transistor 350 is turned on.

Next, if a falling edge of a clock signal CLK occurs, the first PMOS transistor 320 is turned on and the second NMOS transistor 350 is turned off. Due to this, a signal delivered to the third node N3 shifts into a high level. Moreover, the short pulse generator generates a rising edge of the sense amplifier enable signal SA_EN in response to a rising edge of a signal delivered to the third node N3. As a result, the sense amplifier driver 142 generates a sense amplifier enable signal SA_EN in response to a falling edge of the clock signal CLK in the low speed operation mode.

As mentioned above, the sense amplifier driver 142 generates a sense amplifier enable signal SA_EN in response to one that occurs later among a falling edge of the clock signal CLK and a rising edge of the delay clock signal D_CLK. Due to this, an occurrence time point of the sense amplifier enable signal SA_EN in the high speed operation mode in which a clock signal CLK of a high frequency is inputted is determined according to a fixed delay time. On the contrary, as a pulse width of the clock signal CLK is increased in the low speed operation mode in which a clock signal CLK of a low frequency is inputted, an occurrence time point of the sense amplifier enable signal SA_EN is delayed further.

Figure 5:
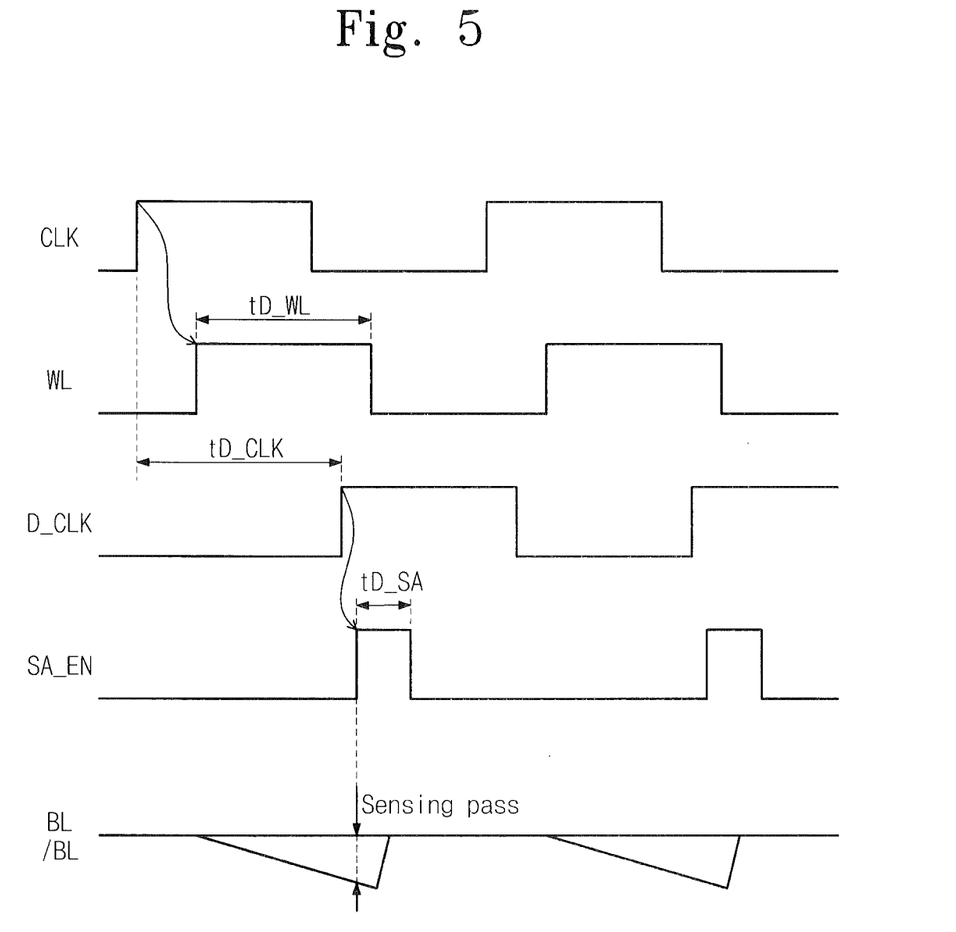
FIG. 5 is a timing diagram illustrating a high speed operation mode of a SRAM device according to an embodiment of the inventive concept.

FIG. 5 is a timing diagram illustrating a high speed operation mode of a SRAM device according to an embodiment of the inventive concept. That is, referring to FIG. 5, the SRAM device is synchronized with a clock signal CLK of a high frequency. Referring to FIG. 5, a word line signal WL shifts into a high level in response to a rising edge of the clock signal CLK. A pulse width of the word line signal WL is determined by a fixed delay time tD_WL of the signal delay unit 210 shown in FIG. 3. In order for a stable operation, the fixed delay time tD_WL may be set longer than a develop time of a bit line pair BL and /BL.

The sense amplifier enable signal SA_EN shifts into a high level in response to a rising edge of the delay clock signal D_CLK. At this point, the sense amplifier 121 of FIG. 2 performs a sense operation. In order to prevent an operation error, a sense operation should be performed after a voltage difference between a bit line pair BL and /BL becomes greater than a critical value. Accordingly, the fixed delay time tD_CLK between the clock signal CLK and the delay clock signal D_CLK is set to allow the sense amplifier enable signal SA_EN to shift into a high level after a voltage difference between a bit line pair BL and /BL becomes greater than a critical value.

A pulse width of the sense amplifier enable signal SA_EN is determined according to a fixed delay time tD_SA of the signal delay unit 310 shown in FIG. 4. However, a pulse width of the sense amplifier enable signal SA_EN does not affect a sense operation greatly because the sense operation is performed at a rising edge of the sense amplifier enable signal SA_EN.

Figure 6:
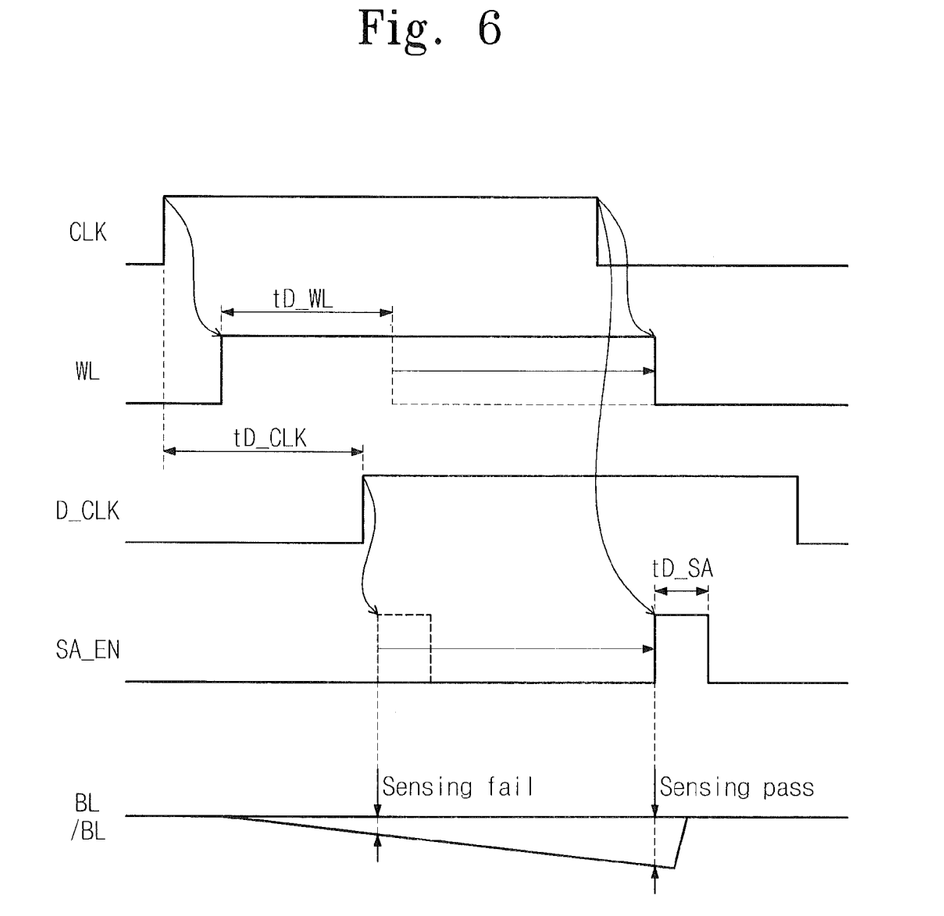
FIG. 6 is a timing diagram illustrating a low speed operation mode of a SRAM device according to an embodiment of the inventive concept.

FIG. 6 is a timing diagram illustrating a low speed operation mode of a SRAM device according to an embodiment of the inventive concept. That is, as shown in FIG. 6, the SRAM device is synchronized to a clock signal CLK of a low frequency. Referring to FIG. 6, a word line signal WL shifts into a high level in response to a rising edge of the clock signal CLK. However, unlike the high speed operation mode, the word line signal WL shifts into a low level in response to a falling edge.

A falling edge of the clock signal CLK in the low speed operation mode occurs after a falling edge of a word line signal in the high speed operation mode. Accordingly, compared to the high speed operation mode, a pulse width of the word line signal WL is increased in the low speed operation mode. This means that a pulse width of the word line signal WL is increased more than a pulse width, which is determined according to a fixed delay time tD_WL of the signal delay unit 210 shown in FIG. 3. That is, it means that a pulse width of the word line signal WL is increased if a pulse width of the clock signal CLK is increased in the low speed operation mode. If a pulse width of the word line signal WL in the low speed operation mode, a develop time (which is used for increasing a voltage difference between pairs of lines BL and /BL more than a critical value) is obtained.

Unlike the high speed operation mode, the sense amplifier enable signal SA_EN shifts into a high level in response to a falling edge of the clock signal CLK. Due to this, as a pulse width of the clock signal CLK is increased, a rising edge of the sense amplifier enable signal SA_EN occurs later compared to the high speed operation mode. This means that a sense operation may be performed after a voltage difference between a bit line pair BL and /BL is greater than a critical value. Accordingly, the SRAM device may perform a stable sense operation.

Compared to a high speed operation mode, a develop time of a bit line pair BL and /BL is longer in the low speed operation mode. Due to this, if a sense operation is performed in the low speed operation mode at the same time point as the high speed operation mode, a voltage difference between pairs of lines BL and /BL may be sensed below a critical value, such that an operation error may occur. In order to prevent this operation error, the SRAM device of the inventive concept generates a word line signal having a pulse width that is increased as a pulse width of the clock signal CLK is increased in a low speed operation mode. Additionally, the SRAM device generates a sense amplifier enable signal to delay a sense operation time point. Accordingly, the SRAM device may perform a stable sense operation.

In relation to a semiconductor memory device according to embodiments of the inventive concept, a pulse width and a detection operation time point of a word line signal can be adjusted according to a frequency change of a clock signal. Accordingly, the semiconductor memory device can perform a stable operation in all of a high speed operation mode synchronized to a clock signal of a high frequency and a low speed operation mode synchronized to a clock signal of a low frequency.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. An integrated circuit memory device, comprising:
an array of memory cells electrically coupled to a plurality of word lines;
a word line driver circuit electrically coupled to the plurality of word lines, said word line driver circuit comprising a variable-width pulse generator containing a first delay unit therein, said word line driver circuit configured to drive a selected one of the plurality of word lines with a first word line signal having a leading edge synchronized with a leading edge of a clock signal and a trailing edge synchronized with a trailing edge of the clock signal when a one-half period of the clock signal is greater than a length of delay provided by the first delay unit and further configured to drive the selected one of the plurality of word lines with a second word line signal having a leading edge synchronized with the leading edge of a clock signal and a trailing edge synchronized with an edge of a signal generated by the first delay unit when the one-half period of the clock signal is less than the length of the delay provided by the first delay unit.

2. The memory device of claim 1, wherein the first delay unit is responsive to the clock signal; and wherein said variable-width pulse generator comprises a logic circuit having a first input terminal responsive to the clock signal and a second input terminal electrically connected to an output of the first delay unit.

3. The memory device of claim 2, wherein the delay provided by the first delay unit is determined by an odd number of inverters therein.

4. The memory device of claim 2, wherein said variable-width pulse generator further comprises a totem pole arrangement of a plurality of transistors.

5. The memory device of claim 4, wherein the logic circuit is an AND gate; and wherein the totem pole arrangement of the plurality of transistors comprises a first PMOS transistor having a gate terminal responsive to the clock signal and a second PMOS transistor having a gate terminal electrically connected to an output of the AND gate.

6. The memory device of claim 5, wherein the totem pole arrangement of the plurality of transistors further comprises an NMOS transistor having a gate terminal electrically connected to the output of the AND gate.

7. The memory device of claim 6, wherein the word line driver circuit further comprises a latch having an input terminal electrically connected to an output of the variable-width pulse generator and an output terminal electrically connected to the selected one of the plurality of word lines.

8. The memory device of claim 1, wherein said variable-width pulse generator comprises:
a logic circuit having a first input terminal responsive to the clock signal and a second input terminal electrically connected to an output of the first delay unit; and
a totem pole arrangement of a plurality transistors, said totem pole arrangement comprising:
a first PMOS pull-up transistor having a gate terminal responsive to the clock signal;
a second PMOS pull-up transistor having a gate terminal electrically connected to an output of the logic circuit; and
an NMOS pull-down transistor having a gate terminal electrically connected to the output of the logic circuit.

9. The memory device of claim 1, further comprising:
a sense amplifier circuit electrically coupled to said array of memory cells by a plurality of pairs of bit lines; and
a sense amplifier driver configured to drive said sense amplifier with a sense amplifier enable pulse in response to the clock signal.

10. The memory device of claim 9, wherein said sense amplifier driver comprises a pulse generator containing a second delay unit therein; and wherein a delay provided by the second delay unit sets a duration of the sense amplifier enable pulse.

11. The memory device of claim 10, wherein a leading edge of the sense amplifier enable pulse is synchronized with a trailing edge of the clock signal.

12. The memory device of claim 11, further comprising a clock delay circuit configured to generate a delayed clock signal in response to the clock signal; and wherein said sense amplifier driver is responsive to the clock signal and the delayed clock signal.

13. The memory device of claim 12, wherein said sense amplifier driver further comprises a totem pole arrangement of a plurality of transistors, said totem pole arrangement comprising:
- a first PMOS pull-up transistor having a gate terminal responsive to the clock signal;
- a second PMOS pull-up transistor having a gate terminal responsive to an inverted version of the delayed clock signal; and
- an NMOS pull-down transistor having a gate terminal responsive to the inverted version of the delayed clock signal.

14. An integrated circuit memory device, comprising:
- an array of random access memory (RAM) cells electrically coupled to a plurality of word lines;
- a word line driver circuit electrically coupled to the plurality of word lines, said word line driver circuit comprising a variable-width pulse generator containing a first delay unit therein, said word line driver circuit configured to drive a selected one of the plurality of word lines with a word line pulse having a minimum duration set by the first delay unit and a maximum duration equivalent to a one-half period of a clock signal.

15. The memory device of claim 14, wherein said word line driver circuit is configured to operate with clock signals having different frequencies; and wherein an active phase of the word line pulse has a duration equivalent to the minimum duration for all clock signals having periods less than two times a delay provided by the delay unit.

16. A semiconductor memory device comprising:
- a memory cell array including a plurality of memory cells;
- a bit line pair connected to the memory cell array; and
- a word line driver connected to the memory cell array through a word line and driving the word line;
- wherein the word line driver adjusts a pulse width of a word line signal provided to the word line according to a frequency of a clock signal, to increase a voltage difference between the bit line pair more than a critical value; and
- wherein as the frequency of the clock signal is decreased, the pulse width of the word line signal is increased.

17. The semiconductor memory device of claim 16, further comprising:
- a sense amplifier for sensing a voltage difference of the bit line pair; and
- a sense amplifier driver for driving the sense amplifier to sense the voltage difference of the bit line pair after the voltage difference of the bit line pair is increased more than the critical value.

18. The semiconductor memory device of claim 16, wherein each of the memory cells has a latch structure.

19. A semiconductor memory device comprising:
- a memory cell array including a plurality of memory cells;
- a bit line pair connected to the memory cell array; and
- a word line driver connected to the memory cell array through a word line and driving the word line;
- wherein the word line driver adjusts a pulse width of a word line signal provided to the word line according to a frequency of a clock signal, to increase a voltage difference between the bit line pair more than a critical value;
- wherein when the frequency of the clock signal is increased more than a reference value, the pulse width of the word line signal has a fixed value.

* * * * *